United States Patent
Borkar et al.

(10) Patent No.: US 7,568,115 B2
(45) Date of Patent: Jul. 28, 2009

(54) POWER DELIVERY AND POWER MANAGEMENT OF MANY-CORE PROCESSORS

(75) Inventors: Shekhar Borkar, Beaverton, OR (US); Tanay Karnik, Portland, OR (US); Shu-ling Garver, Scappoose, OR (US)

(73) Assignee: Intel Corporation, Santa Clara, CA (US)

( * ) Notice: Subject to any disclaimer, the term of this patent is extended or adjusted under 35 U.S.C. 154(b) by 452 days.

(21) Appl. No.: 11/238,489

(22) Filed: Sep. 28, 2005

(65) Prior Publication Data

US 2007/0070673 A1    Mar. 29, 2007

(51) Int. Cl.
    G06F 1/26    (2006.01)
(52) U.S. Cl. .................... 713/300; 713/320
(58) Field of Classification Search ......... 713/300–320, 713/323, 324
    See application file for complete search history.

(56) References Cited

U.S. PATENT DOCUMENTS

| | | | |
|---|---|---|---|
| 5,410,467 A | 4/1995 | Smith et al. | |
| 6,335,565 B1 | 1/2002 | Miyamoto et al. | |
| 6,469,895 B1 | 10/2002 | Smith et al. | |
| 6,674,646 B1 * | 1/2004 | Golshan et al. | 361/760 |
| 6,791,846 B2 | 9/2004 | Smith et al. | |
| 6,861,739 B1 * | 3/2005 | Bhavnagarwala et al. | 257/691 |
| 6,952,748 B1 * | 10/2005 | Guerrero et al. | 710/113 |
| 7,274,930 B2 | 9/2007 | Navendra | |
| 2002/0087906 A1 | 7/2002 | Mar et al. | |
| 2002/0144036 A1 * | 10/2002 | Osburn et al. | 710/104 |
| 2003/0065966 A1 | 4/2003 | Poisner | |
| 2003/0081389 A1 * | 5/2003 | Nair et al. | 361/764 |
| 2004/0142603 A1 | 7/2004 | Walker | |
| 2005/0127758 A1 | 6/2005 | Atkinson et al. | |
| 2005/0207133 A1 | 9/2005 | Pavier et al. | |

(Continued)

FOREIGN PATENT DOCUMENTS

EP    0978781    9/2000

(Continued)

OTHER PUBLICATIONS

Rhee, et al: Many-to-Many Core-Switch Mapping in 2-D Mesh NoC Architectures; Korea; 6 pages.

(Continued)

Primary Examiner—Dennis M Butler
(74) Attorney, Agent, or Firm—Guojun Zhou

(57) ABSTRACT

According to embodiments of the disclosed subject matter in this application, a power management system with multiple voltage regulator ("VRs") may be used to supply power to cores in a many-core processor. Each VR may supply power to a core or a part of a core. Different VRs may provide multiple voltages to a core/part in the many-core processor. The value of the output voltage of a VR may be modulated under the direction of the core/part to which the voltage regulator supplies power. In one embodiment, the multiple VRs may be integrated with cores in a single die. In another embodiment, the power management system with multiple VRs may be on a die ("the VR die") separate from the die of the many-core processor. The VR die may be included in the same package as the many-core processor die.

20 Claims, 9 Drawing Sheets

U.S. PATENT DOCUMENTS

| | | |
|---|---|---|
| 2006/0041763 A1 | 2/2006 | Borkar et al. |
| 2006/0065962 A1 | 3/2006 | Narendra et al. |
| 2006/0071650 A1 | 4/2006 | Navendra |
| 2006/0099734 A1 | 5/2006 | Navendra |

FOREIGN PATENT DOCUMENTS

| | | |
|---|---|---|
| EP | 1555595 | 7/2005 |
| EP | 1736851 | 12/2006 |
| GB | 2399684 | 9/2004 |
| WO | WO03014902 | 2/2003 |
| WO | WO03027820 | 3/2003 |
| WO | WO 03/073250 | 9/2003 |

OTHER PUBLICATIONS

Simpson: Linear and Switching Voltage Regulator Fundamentals; National Semiconductor; 29 pages.

International Search Report for related PCT matter dated May 7, 2007.

International Preliminary Report on Patentability for related PCT matter dated Apr. 10, 2008.

PCT Search Report PCT/US2005/035475, mailed Feb. 8, 2006, for corresponding foreign matter P20117PCT.

J. W. Tschanz et al., "Adaptive Body Bias for Reducing Impacts of Die-to-Die and Within-Die Parameter Variations on Microprocessor Frequency and Leakage", IEEE Journal of Solid State Circuits, vol. 37, No. 11 Nov. 2002.

A Mason et al. "A Low-Power Wireless Microinstrumentation System for Environmental Monitoring", IEEE IX International Conference on Solid State Sensors and Actuators, Jun. 25-29, 1995, pp. 107-110.

* cited by examiner

US 7,568,115 B2

POWER DELIVERY AND POWER MANAGEMENT OF MANY-CORE PROCESSORS

BACKGROUND

1. Field

This disclosure relates generally to processors and, more specifically, to processors that have many cores.

2. Description

Process technology scaling has enabled many-core superscalar microprocessors, e.g. there may be 256 processor cores on a single die. The process technology scaling is achieved by scaling down device sizes and lowering supply voltages. A many-core processor may have better performance than a single-core or a multi-core processor because many cores may work in parallel to achieve higher performance. Additionally, a many-core processor may consume less power than a single-core or multi-core processor because each core in the many-core processor normally requires a lower voltage supply than a core in the single-core or multi-core processor although the maximum voltage may be the same. Because basic components (e.g., transistors) are smaller, lines are thinner, and distances between components/lines are finer inside a many-core processor than those in a single-core or multi-core processor, the many-core processor may be less resistant to heat. Thus, it is desirable to reduce the power consumption by a many-core processor.

In a typical computer system using a many-core processor, all of the cores in the many-core processor are supplied with the same voltage. The voltage regulator ("VR") on the motherboard supplies a single voltage ("Vcc") to all the cores and storage units (e.g., memories and caches) in the many-core processor and supplies another voltage ("Vtt") to all of the input/output ("I/O") units in the processor.

However, cores in a many-core processor may require different supply voltages. The operation of a core depends on application, core temperature, transient current consumption, reliability, and other factors. For example, in some applications, some cores may not be active until they are required to function after some other cores are deemed unreliable due to variations and time dependent degradation. Those inactive cores may only require a very low supply voltage or may be simply shut off. For those active cores, their voltage requirements may be different. Even inside a single core, non-active parts may be shut down and non-performance-critical parts may be put on lower voltage to save active power. Thus, variable core-level or even subcore-level Vcc modulation and fast activation/shut-off may provide significant power savings. Such desirable features of delivering voltages to a many-core processor require multi-Vcc supply rather than a single Vcc supply.

It is difficult to supply multi-VCC to a many-core processor through motherboard VRs. Each Vcc supply may have multiple phases and each phase needs to have its own inductor. An external VR module ("VRM") on the motherboard is not likely to enable a many-Vcc solution because a motherboard cannot accommodate so many inductors. Additionally, the motherboard based power delivery system does not have enough area on either the mother board, or the socket, or the package to route separate supply voltages to each of the cores and/or other units in the many-core processor. Furthermore, the response time of a motherboard VR (typically in the order of milliseconds) is typically not quick enough to respond to changes of a core's voltage needs (typically in the order of nanoseconds). Therefore, it is desirable to have a solution under which multi-VCC may be supplied to a many-core processor and under which voltage supply to a core may be quickly activated or shut off.

BRIEF DESCRIPTION OF THE DRAWINGS

The features and advantages of the disclosed subject matter will become apparent from the following detailed description of the subject matter in which.

DETAILED DESCRIPTION

According to embodiments of the disclosed subject matter in this application, a power management system with multiple VRs may be used to supply power to cores in a many-core processor. Each VR may supply power to at least one core. Different VRs may provide multiple Vcc's to cores in the many-core processor. The value of the output voltage of a VR may be modulated under the direction of the core to which the voltage regulator supplies power. In one embodiment, the multiple VRs may be integrated with cores in a single die. For example, each core may have its own VR which is located adjacent to the die area of the core. In another embodiment, the multiple VRs and the cores may share a single die with VRs surrounding the cores in the die.

In another embodiment, the power management system with multiple VRs may be on a die ("the VR die") separate from the die of the many-core processor. Separate voltage identification ("VID") interconnects between the many-core processor die and the VR die may be used to specify the Vcc needs of each core. The VR die may be included in the same package as the many-core processor die. In one example, the VR die may be sandwiched between the package substrate and the many-core processor die. In another example, the VR die may be mounted to a side of the package substrate while the many-core processor die is mounted to the other side of the package substrate.

According to embodiments of the disclosed subject matter in the present application, cores in a many-core processor may be supplied with different voltages depending on the status of its activity, which may result in significant reduction of power consumption by the many-core processor. Additionally, a power management system according to an embodiment of the disclosed subject matter may respond quickly to specific voltage needs by a core.

Reference in the specification to "one embodiment" or "an embodiment" of the disclosed subject matter means that a particular feature, structure or characteristic described in connection with the embodiment is included in at least one embodiment of the disclosed subject matter. Thus, the appearances of the phrase "in one embodiment" appearing in various places throughout the specification are not necessarily all referring to the same embodiment.

Figure 1:
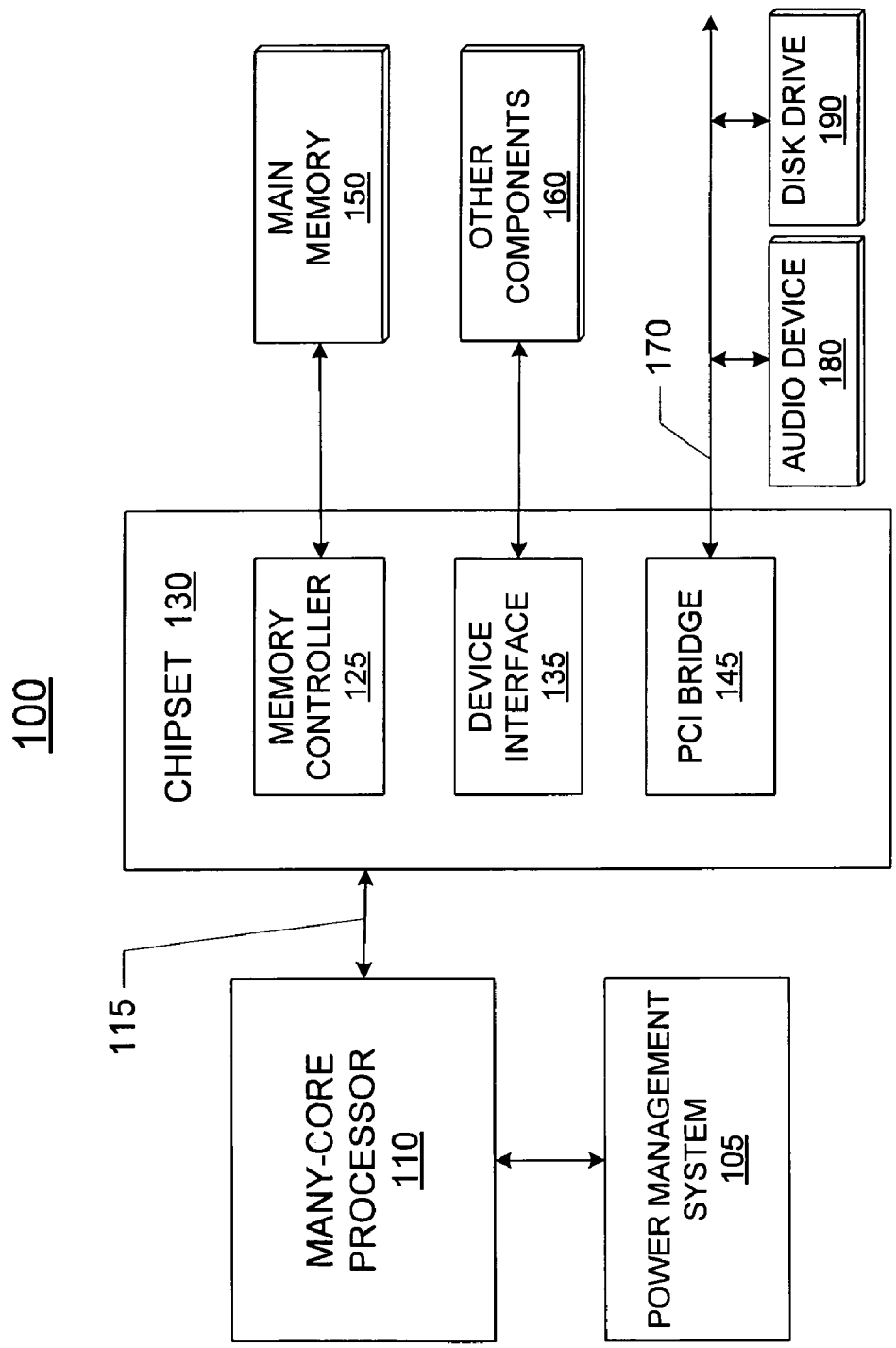
FIG. 1 shows one example computing system where a many-core processor may be used.

FIG. 1 shows one example computing system 100 where a many-core processor may be used. Computing system 100 may comprise one or more processors 110 coupled to a system interconnect 115. Processor 110 may be a many-core processor whose power is supplied by a power management system 105 with multiple VRs (not shown in the figure). Different VRs may provide different voltages and the output voltage of each VR may be modulated at the direction of a core to which the VR supplies power. The power management system may reside in the same die as the many-core processor. The power management system may also reside in a separate die from the many-core processor with the VR die mounted in the same package as the processor die.

The computing system 100 may also include a chipset 130 coupled to the system interconnect 115. Chipset 130 may include one or more integrated circuit packages or chips. Chipset 130 may comprise one or more device interfaces 135 to support data transfers to and/or from other components 160 of the computing system 100 such as, for example, BIOS firmware, keyboards, mice, storage devices, network interfaces, etc. Chipset 130 may be coupled to a Peripheral Component Interconnect (PCI) bus 170. Chipset 130 may include a PCI bridge 145 that provides an interface to the PCI bus 170. The PCI Bridge 145 may provide a data path between the processor 110 as well as other components 160, and peripheral devices such as, for example, an audio device 180 and a disk drive 190. Although not shown, other devices may also be coupled to the PCI bus 170.

Additionally, chipset 130 may comprise a memory controller 125 that is coupled to a main memory 150. The main memory 150 may store data and sequences of instructions that are executed by the processor 110 or any other device included in the system. The memory controller 125 may access the main memory 150 in response to memory transactions associated with the processor 110, and other devices in the computing system 100. In one embodiment, memory controller 150 may be located in processor 110 or some other circuitries. The main memory 150 may comprise various memory devices that provide addressable storage locations which the memory controller 125 may read data from and/or write data to. The main memory 150 may comprise one or more different types of memory devices such as Dynamic Random Access Memory (DRAM) devices, Synchronous DRAM (SDRAM) devices, Double Data Rate (DDR) SDRAM devices, or other memory devices.

Figure 2:
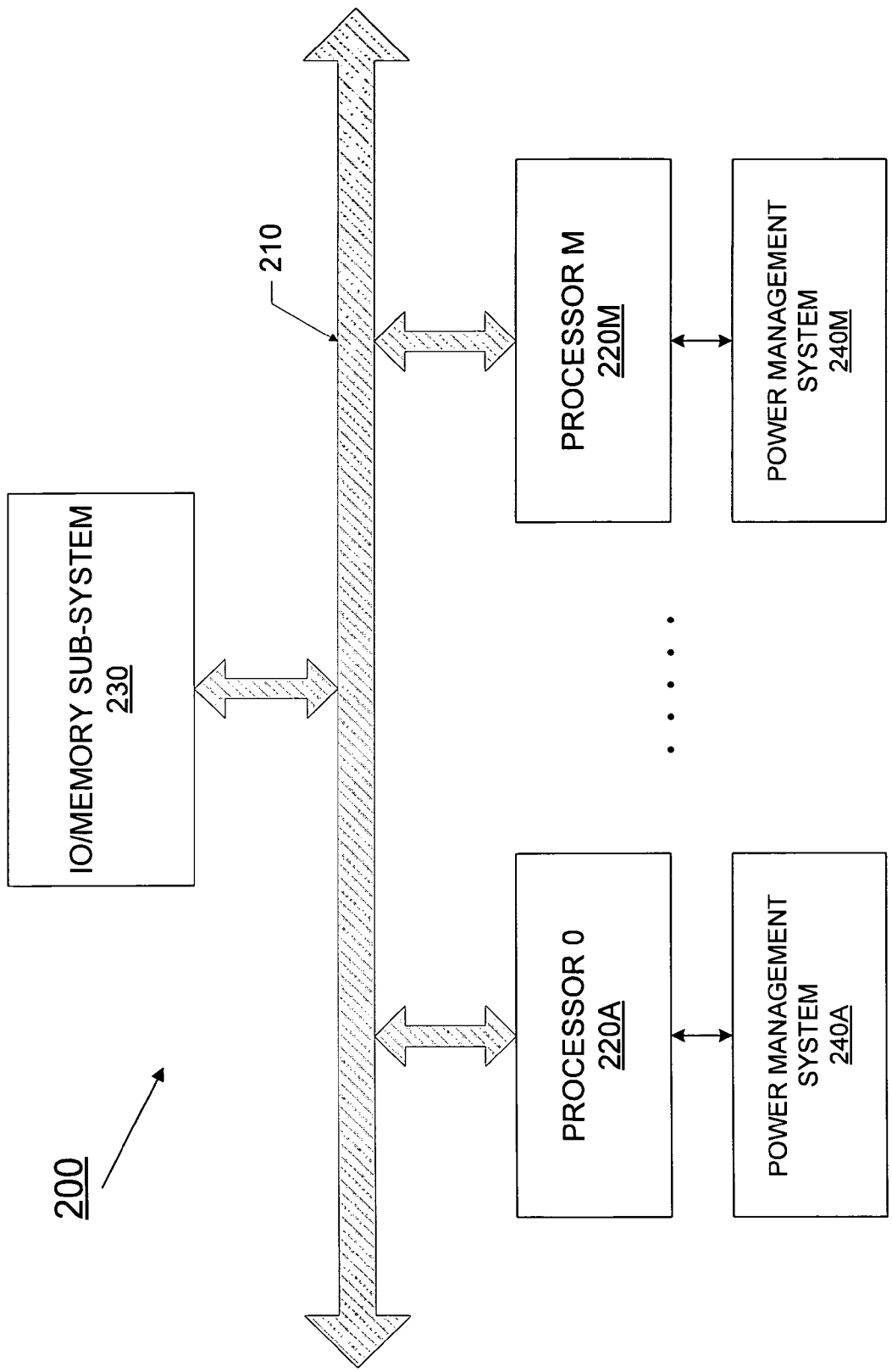
FIG. 2 shows another example computing system where a many-core processor may be used.

FIG. 2 shows another example computing system 200 where a many-core processor may be used. System 200 may comprise multiple processors such as processors 220A. One or more processors in system 200 may have many cores. The power needed by a many-core processor may be supplied by a power management system (e.g., 240A, 240M) with multiple VRs (not shown in the figure). Different VRs may provide different voltages and the output voltage of each VR may be modulated at the direction of a core to which the VR supplies power. The power management system may reside in the same die as the many-core processor. The power management system may also reside in a separate die from the many-core processor with the VR die mounted in the same package as the processor die. Processors in system 200 may be connected to each other using a system interconnect 210. System interconnect 210 may be a Front Side Bus (FSB). Each processor may be connected to Input/Output (IO) devices as well as memory 230 through the system interconnect.

Figure 3:
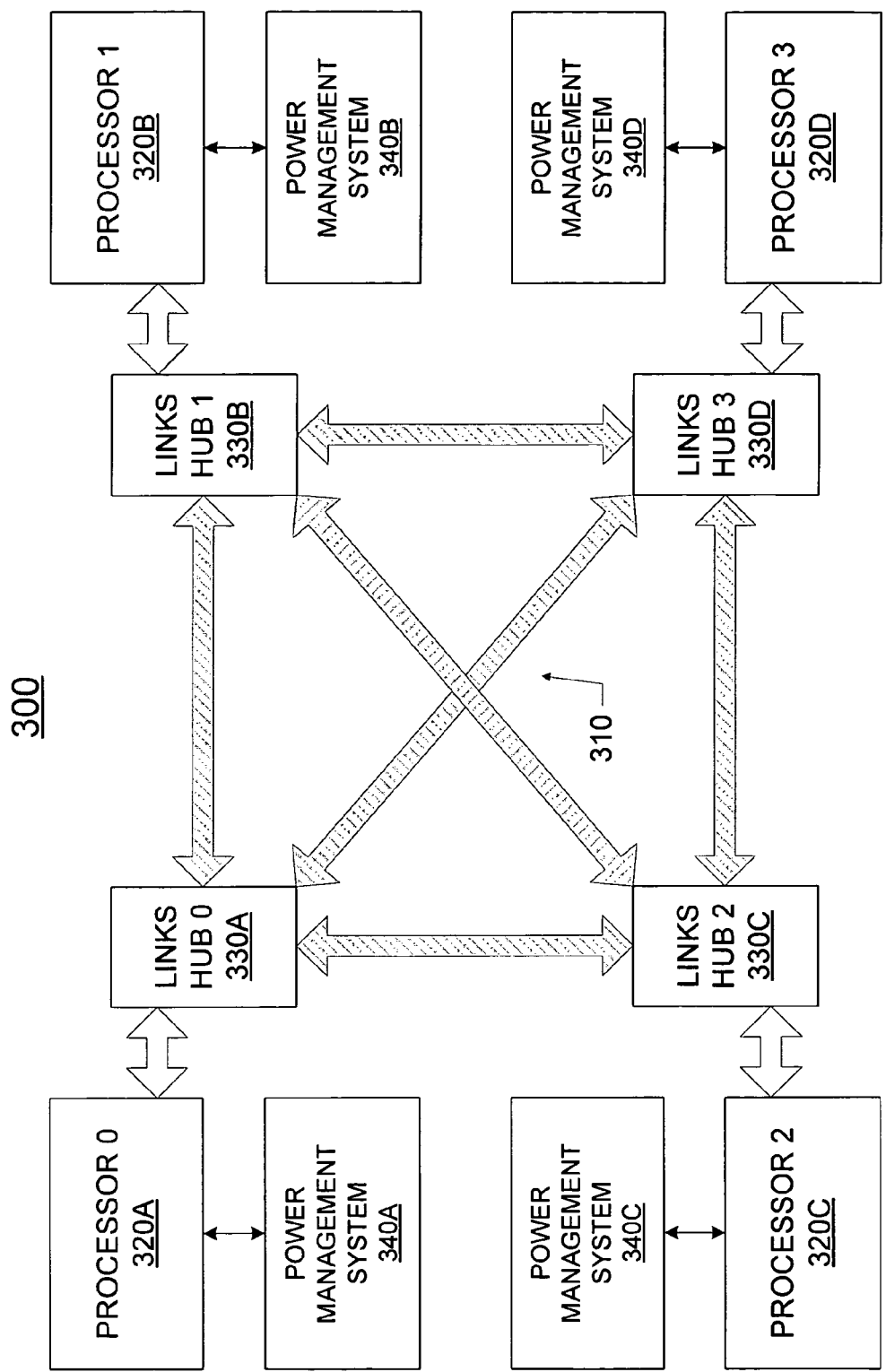
FIG. 3 shows yet another example computing system where a many-core processor may be used.

FIG. 3 shows yet another example computing system 300 where a many-core processor may be used. In system 300, system interconnect 310 that connects multiple processors (e.g., 320A, 320B, 320C, and 320D) is a links-based point-to-point connection. Each processor may connect to the system interconnect through a links hub (e.g., 330A, 330B, 330C, and 330D). In some embodiments, a links hub may be co-located with a memory controller, which coordinates traffic to/from a system memory. One or more processor may have many cores. The power needed by a many-core processor may be supplied by a power management system (e.g., 340A, 340B, 340C, and 340D) with multiple VRs (not shown in the figure). Different VRs may provide different voltages and the output voltage of each VR may be modulated at the direction of a core to which the VR supplies power. The power management system may reside in the same die as the many-core processor. The power management system may also reside in a separate die from the many-core processor with the VR die mounted in the same package as the processor die.

In either FIG. 1, 2, or 3, the many-core processor may be thermally coupled to a cooling system to dissipate heat generated by the processor. The cooling system may comprise a heat spreader attached on the top of the many-core processor package. The heat spreader helps dissipate heat from the many-core processor to ambient air surrounding the heat spreader. In one embodiment, the cooling system may comprise a heat pipe with one end thermally coupled to the top of the many-core processor package and the other end thermally coupled to a heat exchanger. The heat pipe helps transmit heat from the many-core processor to the heat exchanger which may dissipate the heat outside a computing system.

Figure 4:
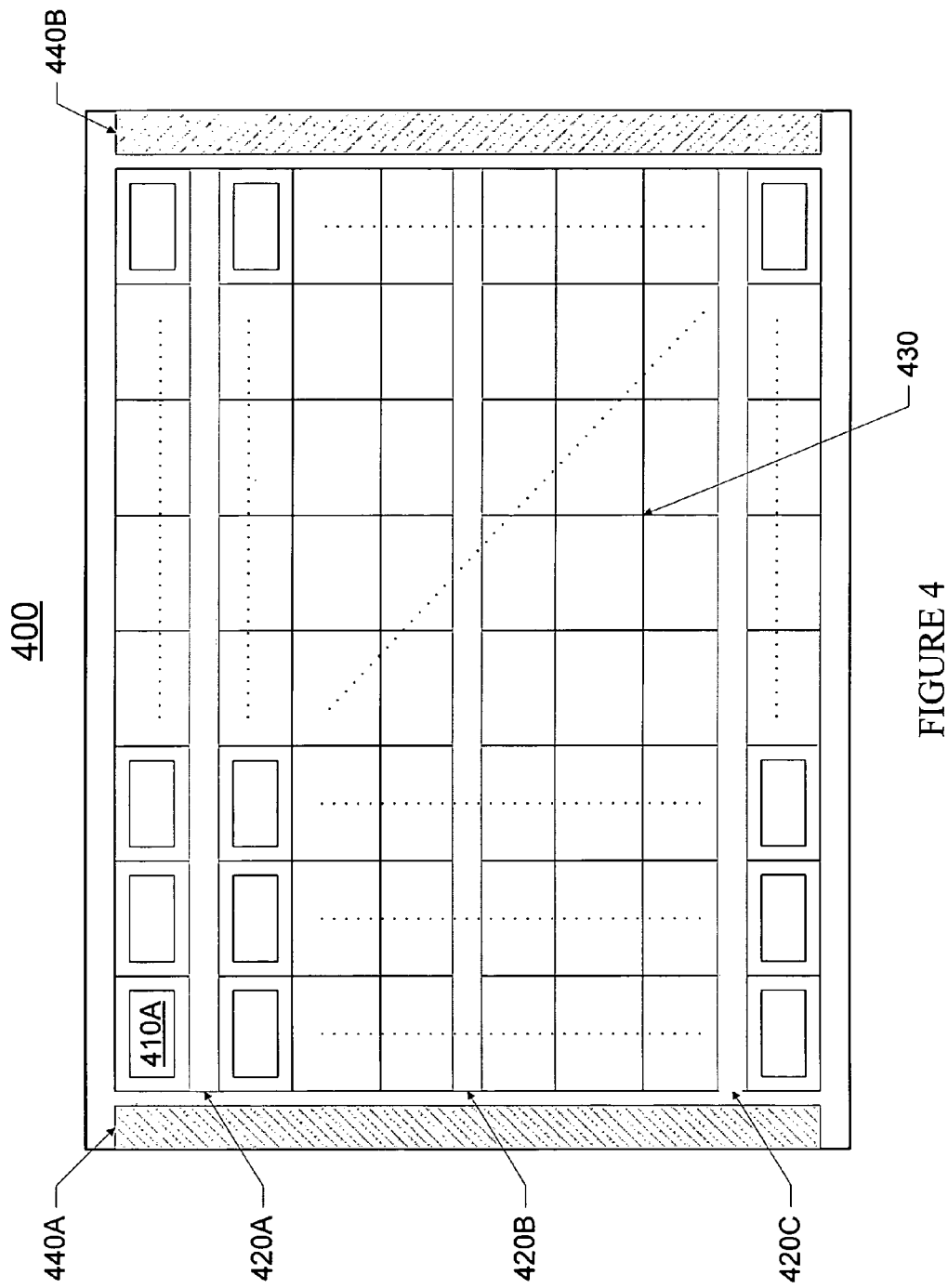
FIG. 4 illustrates a structure of an example many-core processor.

FIG. 4 illustrates the structure of an example many-core processor 400. Processor 400 comprises an 8-by-8 array of cores (e.g., core 410A) sitting on a two-dimensional (2D) interconnect fabric 430. Each core may have its local memory (not shown in the figure). There may also be shared memories (e.g., 420A, 420B, and 420C) attached to the interconnect fabric 430. The cores in processor 400 are surrounded by input/output ("I/O") interconnect area. The I/O interconnects are typically on the periphery (e.g., north, south, east, and west boundaries) to enable efficient vertical current delivery to the cores. For simplicity, FIG. 4 only shows west side I/O unit 440A and east side I/O unit 440B in the processor die. Note that I/O interconnects may be embedded among the cores in some other embodiments. Compared to processors that have a single core or only a few cores, the number of cores in a many-core processor is large. As a result, the size of each core in a many-core processor is small compared to those cores in a single-core or multi-core processor. Although FIG. 4 shows an example processor 400 which has only 64 cores, the number of cores in a many-core processor can vary and may be much larger than 64 (e.g., 256, 512, 1024).

Because components in a many-core processor are in smaller dimensions than those in a single-core or multi-core processor, they are less resistant to heat. Thus, it is desirable to reduce power consumption by a many-core processor. In a typical computer system using a many-core processor, all of the cores in the many-core processor are supplied with the same voltage. The voltage regulator ("VR") on the motherboard supplies a single voltage ("Vcc") to all the cores and storage units (e.g., memories and caches) in the many-core processor and supplies another voltage ("Vtt") to all of the input/output ("I/O") units in the processor. As a result of such a single-Vcc power management scheme, a many-core processor may consume more power than it actually needs because cores may require different supply voltages.

The operation of a core depends on application, core temperature, transient current consumption, reliability, and other factors. For example, in some applications, some cores may not be active until they are required to function after some other cores are deemed unreliable due to variations and time dependent degradation. Those inactive cores may only require a very low supply voltage or may be simply shut off. For those active cores, their voltage requirements may be different. Even inside a single core, non-active parts may be shut down and non-performance-critical parts may be put on lower voltage to save active power. Thus, variable core-level or even subcore-level Vcc modulation and fast activation/shut-off may provide significant power savings. There may be several approaches to achieve variable core/subcore-level Vcc modulation and fast activation/shut-off with a power management system for a many-core processor.

Figure 5:
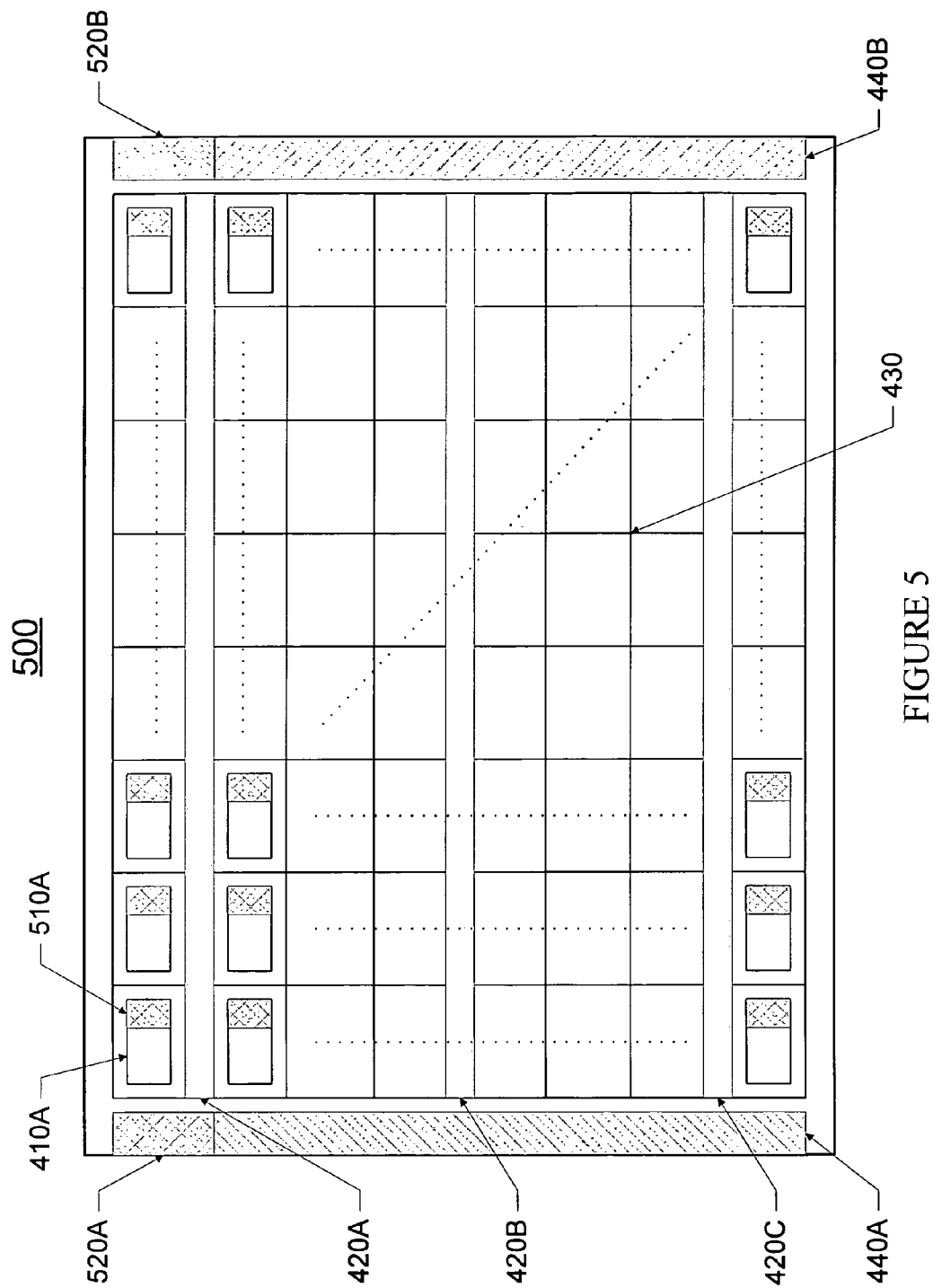
FIG. 5 illustrates a structure of an example many-core processor with each core having its own voltage regulator.

FIG. 5 Illustrates one example structure 500 in which a many-core processor is powered by a power management system that can provide variable core/subcore-level Vcc modulation and the fast activation/shut-off feature. The arrangement of cores and shared memories in structure 500 is similar to that shown in FIG. 4. In structure 500, however, each core has its own local VR (e.g., VR 510A for core 410A). Also each I/O interconnect unit has its own local VR (e.g., VR 520A for I/O unit 440A, and VR 520B for I/O unit 440B). The output voltage of each local VR for a core may be modulated under the control of the core. For example, when a core is active and needs to operate at a high frequency, the core may send a signal to its local VR instructing the VR to supply a high voltage; when a core is performing non-computation intensive work and does not need to operate at a high frequency, the core may request its local VR to supply a low voltage; when a core is not active, the core may instruct its local VR to shut off its power supply. When the local VR receives such a signal from the core, the local VR will act quickly and supply the voltage as requested. Because I/O units have to communicate with external components, it may be desirable that their voltage supply not be modulated.

Although FIG. 5 illustrates one VR per core, there may be multiple cores whose power is supplied by one VR in one embodiment. For example, there is one VR for each column and one VR for each row and these VRs are shared by all of the cores in a many-core processor. In another embodiment, there may be more than one VR for each core, with different VRs supply voltages to different parts inside the core so that different parts of the core may function at different Vcc's. As illustrated by structure 500, VRs are on the same die as cores and are very close to cores to which they supply power. Such close integration between VRs and cores helps minimize the power supply path and thus significantly reduces resistive and inductive losses.

Figure 6:
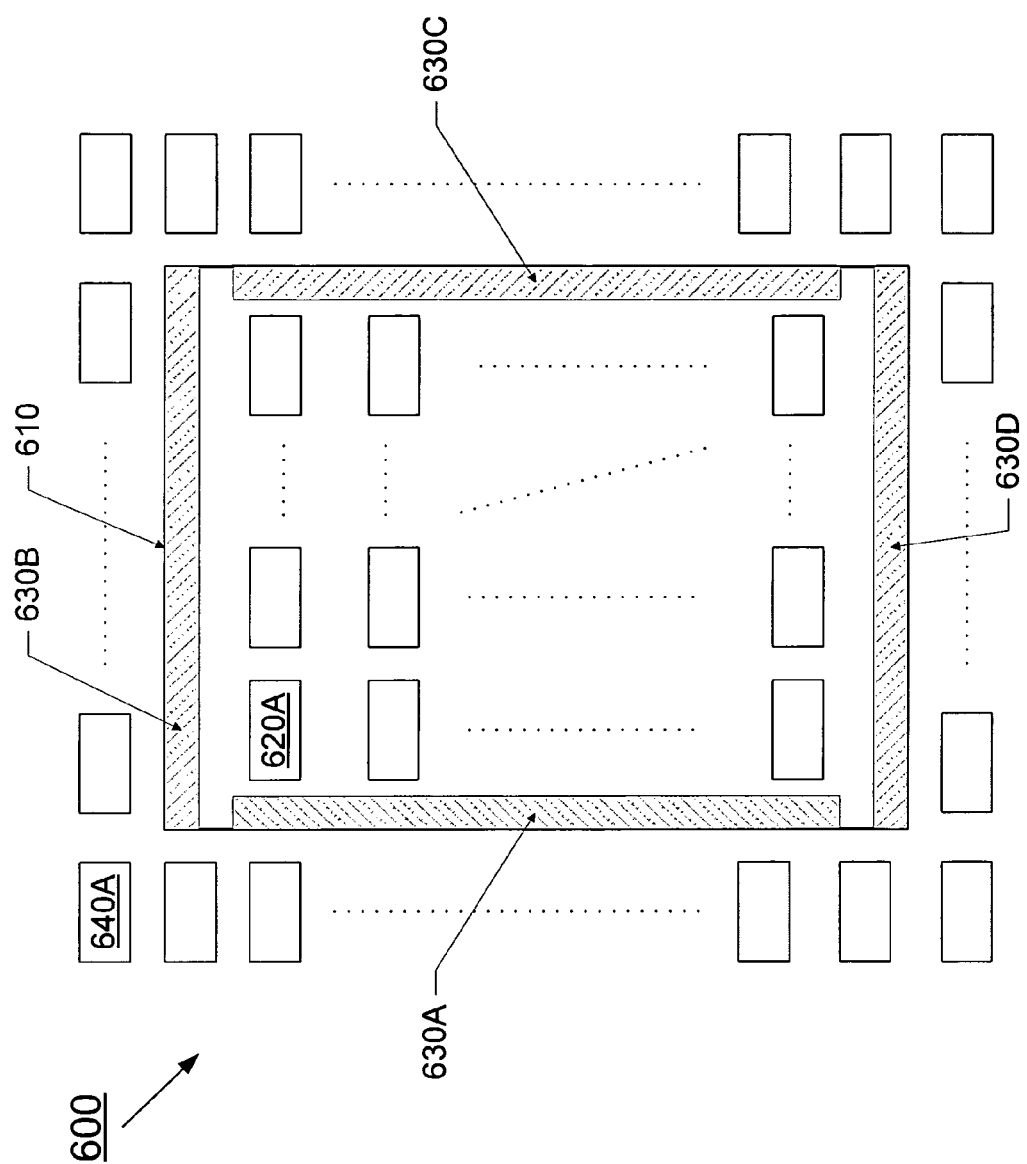
FIG. 6 illustrates a structure of another example many-core processor with voltage regulators surrounding cores.

FIG. 6 illustrates another example structure 600 in which a many-core processor is powered by a power management system that can provide variable core/subcore-level Vcc modulation and the fast activation/shut-off feature. The arrangement of cores and shared memories in structure 600 is similar to that shown in FIG. 4 (shared memories and interconnect fabric are not shown in FIG. 6). Cores (e.g., 620A) are attached to the interconnect fabric through switches. I/O units 630A, 630B, 630C, and 630D are west side I/O unit, north side I/O unit, east side I/O unit, and south side I/O unit. As in structure 500 shown in FIG. 5, in structure 600 VRs (e.g., VR 640A) reside on the same die as cores and I/O units, but are not integrated with cores and/or I/O units in the same manner as that shown in FIG. 5. In structure 600, VRs surround the die area 610 of cores and I/O units. Each VR supplies power to at least one core and/or one I/O unit. In FIG. 600, VRs reside outside the I/O area, however, VRs may reside inside the I/O area but outside the core area in one embodiment. The output voltage of each VR may be modulated under the control of a core (or cores) to which the VR supplies power. Although not shown in FIG. 6, some VRs may be integrated in a way similar to that shown in FIG. 5 while other VRs surround the die area of cores.

In either example 500 (shown in FIG. 5) or example 600 (shown in FIG. 6), the die hosting both cores of the many-core processor and VRs may be mounted to a package substrate which has multiple bins to connect the cores and VRs to a motherboard in a computing system.

In FIGS. 5 and 6, VRs and cores share a single die ("on-die VR"). Such on-die VR arrangements help shorten power delivery paths from VRs to cores and thus reduce resistive and inductive losses of power on the delivery path. Additionally, because VRs and cores to which they supply power are close to each other on the same die, it is relatively easy to route a VID signal from a core to its corresponding VR. However, each VR has multiple phases and each phase needs to have its own inductor. The on-die VR arrangements such as those shown in FIGS. 5 and 6 thus require integrating on-die inductor processing technology into the microprocessor processing technology. It may be expensive to implement such integration in the production of many-core microprocessors.

Figure 7:
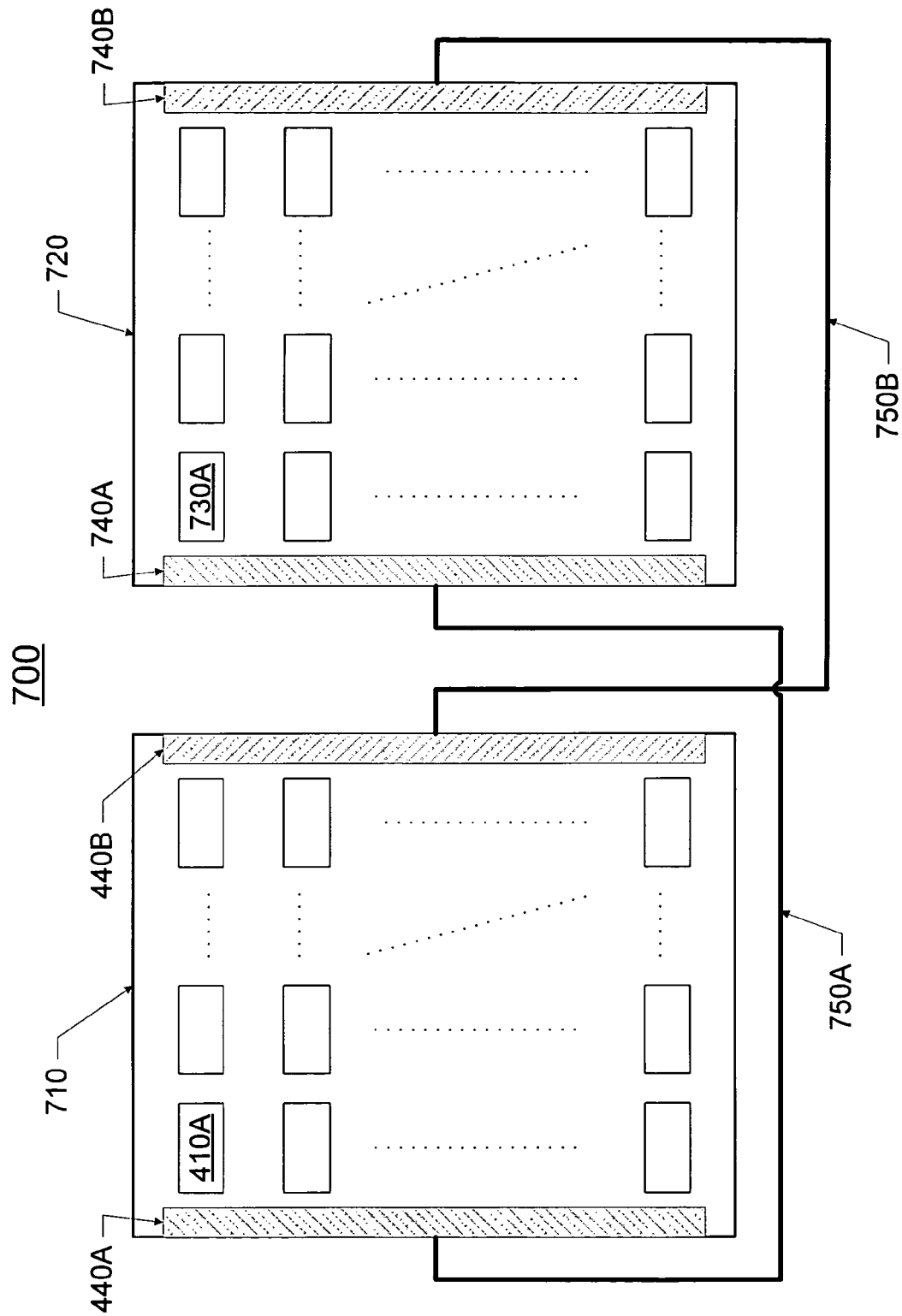
FIG. 7 shows one example approach for many-core processor power management.

FIG. 7 shows another example 700 for delivering many Vcc's to a many-core processor. In example 700, the power management system with many VRs (e.g., VR 730A) is on a separate die ("VR die") 720 from the many-core processor die 710. The VR die may also be referred to as VR module ("VRM"). On the VR die, units 740A and 740B may receive VID request signals from west side I/O unit 440A and ease side I/O unit 440B on the many-core processor die, respectively. In one embodiment, each core on the many-core processor die may have its corresponding VR in the VRM, e.g., core 410A may have its own VR 730A; and each I/O unit may have its own VR in the VRM, e.g., west side I/O unit 440A and east side I/O unit 440B may have their own VRs included in 740A and 740B, respectively. In another embodiment, more than one core and/or I/O unit may share one VR in the VRM. Yet in another embodiment, a core and/or an I/O unit on the many-core processor may have more than one VR to supply voltages to different parts of the core and/or the I/O unit.

Because the many-core processor and its corresponding VRM are located on separate dies, there may be separate VID interconnects routed from the many-core processor to the VRM to specify Vcc needs at various power inputs on the processor. For example, VID interconnects 750A and 750B may deliver VID request signals from west side I/O unit 440A to unit 740A and from east side I/O unit 440B to unit 740B, respectively. Additionally, the VR die may provide body bias signals to the many-core processor for active and leakage power control. Because VRs reside on a separate die, there is no need to integrate VRs with cores in a many-core processor, and it is thus not necessary to use an on-die inductor processing technology in the production of the many-core processor (on-die inductor processing is done on the VR die).

Figure 8:
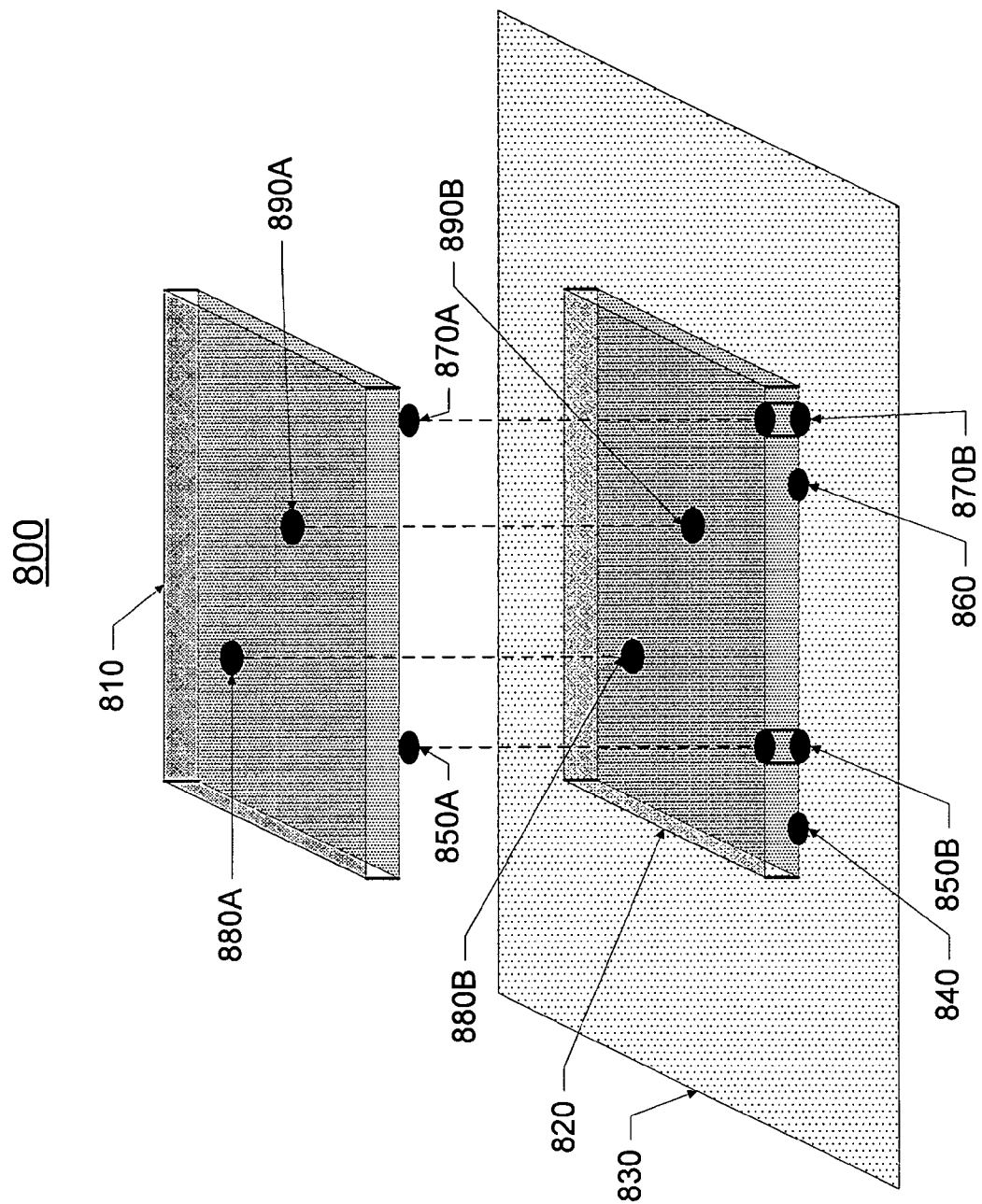
FIG. 8 shows one example for delivering power to and for managing power for a many-core processor.

A separate VR die may be packaged with a many-core processor die in the same package. FIG. 8 shows one example 800 for packaging a VR die and a many-core processor die together in one package. As shown in the figure, VR die 820 is sandwiched between many-core die 810 and package substrate 830. Each VR on the VR die has at least one voltage output point (e.g., 880B and 890B) on the side facing the many-core processor die. Corresponding to each output point on the VR die, there is a voltage receiving point (e.g., 880A and 890A) on the side of the many-core processor die that faces the VR die. Each pair of voltage output and receiving points may be made in such a form that they couple with each other electronically when the VR die and the many-core processor are packaged together as illustrated in FIG. 8. For example, each voltage output point may be made in the form of a connection projection and its corresponding voltage receiving point may be made in the form of a connection pad. When the two dies are packaged together, each connection projection will physically contact its corresponding connection pad. Additionally, there may be connection points for VID signals on both the VR die and the many-core processor die. A VID connection point on the VR die and its corresponding connection point on the many-core processor die may be made in forms similar to those of voltage output and input connection points.

There may be a plurality of connection means (such as pins, solder balls, copper pucks, and so on) (not shown in FIG. 8) mounted in the package substrate on a side other than the side where the VR die is mounted. Such connection means may project, at least partially, out of the package substrate to connect the VR die and the many-core processor die to a motherboard of a computing system. Typically a many-core processor is connected with the motherboard through I/O units on its die, which are typically located on the boundaries of the many-core processor die as shown in FIG. 4. For the I/O units on the many-core processor die to connect to the plurality of connection means in the package substrate, through silicon vias ("TSVs") (e.g., 850B and 870B) may be built in areas on the VR die, corresponding to the I/O areas on the many-core processor die. In addition to connections between the many-core processor die and the plurality of connection means in the package substrate, there are also connections (e.g., 840 and 860) between the VR die and the plurality of connection means in the package substrate. These connections may be for power input and/or control signals to the VR die.

Figure 9:
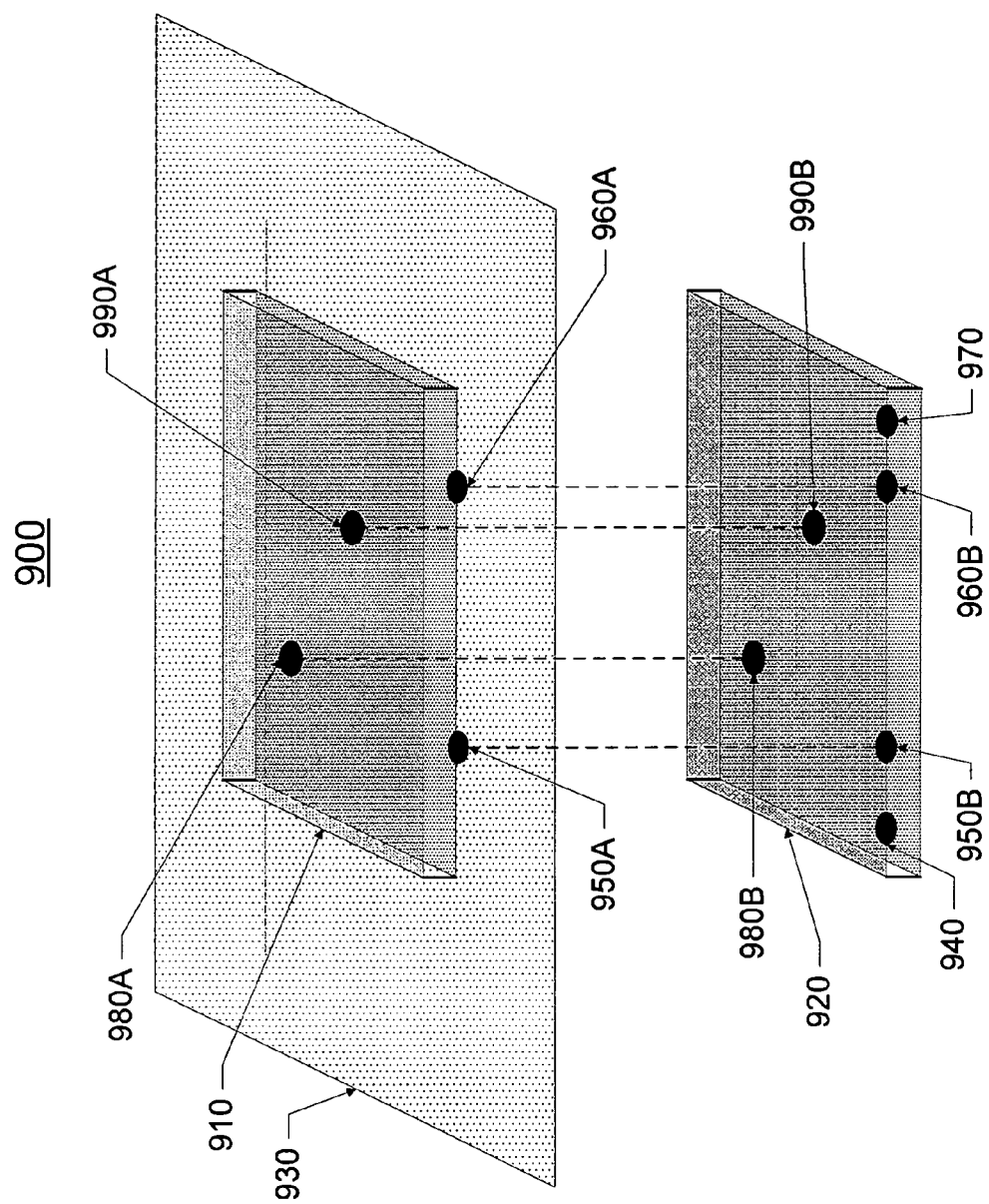
FIG. 9 shows another example for delivering power to and for managing power for a many-core processor.

FIG. 9 shows another example 900 for packaging a VR die and a many-core processor die together in one package. As shown in the figure, package substrate 930 may be sandwiched between many-core die 910 and VR die 920. Each VR on the VR die has at least one voltage output point (e.g., 980B and 990B) on the side facing the package substrate. Corresponding to each output point on the VR die, there is a voltage receiving point (e.g., 980A and 990A) on the side of the many-core processor die that faces the package substrate. Each pair of voltage output and receiving points may be electronically coupled with each other through a connection line in the package substrate. Additionally, there may be connection points for VID signals on both the VR die and the many-core processor die (e.g., 950A, 950B, 960A, and 960B). A VID connection point on the VR die and its corresponding connection point on the many-core processor die may be electronically coupled with each other in ways similar to those used to couple voltage output and input connection points.

There may be a plurality of connection means (such as pins, solder balls, copper pucks, and so on) (not shown in FIG. 9) mounted in the package substrate. The plurality of connection means may project, at least partially, out of the package substrate to connect the VR die and the many-core processor die to a motherboard of a computing system. Typically a many-core processor is connected with the motherboard through I/O units on its die, which are typically located on the boundaries of the many-core processor die as shown in FIG. 4. In addition to connections between the many-core processor die and the plurality of connection means in the package substrate, there are also connections (e.g., 940 and 970) between the VR die and the plurality of connection means in the package substrate. These connections may be for power input and/or control signals to the VR die.

In either example 800 (shown in FIG. 8) or example 900 (shown in FIG. 9), there may be a cooling system thermally coupled to a package of a VR die and a many-core processor die. For example, in example 800, a cooling system may be thermally coupled to the package from the side close to the top surface of the many-core processor die; in example 900, a cooling system may be thermally coupled to the package from the side close to the top surface of the many-core processor die and/or from the side close to the bottom surface of the VR die.

Although embodiments of the disclosed subject matter are described in the context of a many-core processor, what is disclosed in this application can be used for power delivery and power management for any integrated circuit which has multiple parts/units and part/unit-level Vcc modulation as well as fast power activation/shut-off may be needed.

Although an example embodiment of the disclosed subject matter is described with reference to block and flow diagrams in FIGS. 1-9, persons of ordinary skill in the art will readily appreciate that many other methods of implementing the disclosed subject matter may alternatively be used. For example, the order of execution of the blocks in flow diagrams may be changed, and/or some of the blocks in block/flow diagrams described may be changed, eliminated, or combined.

In the preceding description, various aspects of the disclosed subject matter have been described. For purposes of explanation, specific numbers, systems and configurations were set forth in order to provide a thorough understanding of the subject matter. However, it is apparent to one skilled in the art having the benefit of this disclosure that the subject matter may be practiced without the specific details. In other instances, well-known features, components, or modules were omitted, simplified, combined, or split in order not to obscure the disclosed subject matter.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. An apparatus for managing power for an integrated circuit, comprising:
   a package substrate;
   a first die of a voltage regulator module, said first die mounted on said package substrate, said voltage regulator module including a plurality of voltage regulators; and
   a second die of said integrated circuit, said package substrate, said first die, and said second die packed in the same package, said integrated circuit including a plurality of electronic units, wherein each voltage regulator in said first die is electronically coupled to said second die to supply power for and to provide a body bias signal to one or more electronic units in said second die based on specific conditions of said one or more electronic units to optimize power consumption.

2. The apparatus of claim 1, wherein said second die comprises input/output (I/O) interconnects for said plurality of electronic units, said I/O interconnects including interconnects for voltage identification ("VID") signals.

3. The apparatus of claim 2, wherein said VID signals comprise a request from an electronic unit in said second die for a voltage supply with a specific value to a voltage regulator in said first die, said specific value being determined based on specific condition of said electronic unit, wherein upon receiving said request, said voltage regulator supplies said electronic unit with a voltage of said specific value.

4. The apparatus of claim 2, wherein said package substrate is between said first die and said second die.

5. The apparatus of claim 1, wherein each voltage regulator in said first die is aligned with one or more electronic units in said second die, to which the voltage regulator supplies power.

6. The apparatus of claim 1, wherein said integrate circuit comprises a many-core processor, said many-core processor including a plurality of cores, each of said plurality of electronic units including one of said plurality of cores.

7. The apparatus of claim 1, wherein said specific conditions of said one or more electronic units comprise one of software application running on, temperature of, transient current consumption by, reliability of, activeness of, working frequency required by, said one of more electronic units.

8. An apparatus for managing power for an integrated circuit, comprising:
 a package substrate; and
 a die mounted on said package substrate, said die including said integrated circuit and a plurality of voltage regulators, said integrated circuit including a plurality of electronic units, wherein each of said plurality of voltage regulators supplies power for and to provide a body bias signal to one or more of said plurality of electronic units based on specific conditions of said one or more electronic units to optimize power consumption.

9. The apparatus of claim 8, wherein said die comprises input/output (I/O) interconnects for said plurality of electronic units and interconnects for voltage identification ("VID") signals.

10. The apparatus of claim 9, wherein said VID signals comprise a request from an electronic unit for a voltage supply with a specific value to a voltage regulator, wherein upon receiving said request, said specific value being determined based on specific condition of said electronic unit, said voltage regulator supplies said electronic unit with a voltage of said specific value.

11. The apparatus of claim 8, wherein said integrate circuit comprises a many-core processor, said many-core processor including a plurality of cores, each of said plurality of electronic units including one of said plurality of cores.

12. The apparatus of claim 8, wherein said specific conditions of said one or more electronic units comprise one of software application running on, temperature of, transient current consumption by, reliability of, activeness of, working frequency required by, said one of more electronic units.

13. A computing system, comprising:
 a many-core processor, said many-core processor including a plurality of cores;
 a non-volatile memory to store data for said many-core processor; and
 a plurality of voltage regulators to provide power to said plurality of cores;
 wherein each of said plurality of voltage regulators is located in proximity to one or more of said plurality of cores to which the voltage regulator supplies power ("power-receiving object"), and is capable of providing a voltage supply with a specific value requested by the power-receiving object to the power-receiving object and of providing a body bias signal to the power-receiving object, said specific value being determined based on specific condition of the power-receiving object to optimize power consumption of the many-core processor.

14. The system of claim 13, further comprising interconnects for voltage identification ("VID") signals, said VID signals including a request from one of said plurality of cores for a voltage supply with a specific value to one of said plurality of voltage regulators, wherein upon receiving said request, said voltage regulator supplies said core with a voltage of said specific value, said specific value being determined based on specific condition of said core.

15. The system of claim 13, wherein said plurality of voltage regulators reside on a first die and said plurality of cores reside on a second die, said first die and said second die packed with a package substrate in the same package, wherein each voltage regulator in said first die is electronically coupled to said second die to supply power for one or more cores in said second die.

16. The system of claim 15, wherein said package substrate is between said first die and said second die.

17. The system of claim 15, wherein said first die is between said second die and said package substrate.

18. The system of claim 13, wherein said plurality of cores and said plurality of voltage regulators reside on a die, said die packaged with a package substrate.

19. The system of claim 13, further comprising a cooling system thermally coupled to at least one of said many-core processor and said plurality of voltage regulators to dissipate heat generated by at least one of said many-core processor and said plurality of voltage regulators.

20. The system of claim 13, wherein specific condition of the power-receiving object comprises one of software application running on, temperature of, transient current consumption by, reliability of, activeness of, working frequency required by, the power-receiving object.

* * * * *